United States Patent [19]

Tadokoro

[11] Patent Number: 5,438,292

[45] Date of Patent: Aug. 1, 1995

[54] SCHMITT TRIGGER CIRCUIT WITH CMOS INVERTERS AND FILTERING MEANS

[75] Inventor: Kenji Tadokoro, Miyazaki, Japan

[73] Assignee: Oki Electric Industry, Co., Ltd., Tokyo, Japan

[21] Appl. No.: 42,406

[22] Filed: Apr. 2, 1993

[30] Foreign Application Priority Data

Apr. 7, 1992 [JP] Japan ................................ 4-084288

[51] Int. Cl.6 .......................................... H03K 3/3565
[52] U.S. Cl. ...................................... 327/206; 327/345
[58] Field of Search ............... 307/228, 263, 290, 350, 307/355, 445, 490; 328/127, 128; 327/131, 170, 205, 50, 63, 334, 206, 336, 345

[56] References Cited

U.S. PATENT DOCUMENTS

| 2,912,653 | 1/1957 | Tillman | 307/291 |
|---|---|---|---|
| 3,521,242 | 5/1970 | Katz | 307/291 |
| 4,039,862 | 8/1977 | Dingwall et al. | 307/247.1 |
| 4,115,748 | 9/1978 | Kubo et al. | 307/290 |
| 5,086,331 | 2/1992 | Hartgring et al. | 307/291 |

OTHER PUBLICATIONS

Millman & Taub, "Pulse, Digital, and Switching Waveforms", 1965, pp. 375–378 & pp. 396–399.
The Penguine Dictionary of Electronics, E. C. Young, 1988, (pp. 505, 39, 371–372, 199–200, 518, 396).

Primary Examiner—Steven L. Stephan
Assistant Examiner—Shawn Riley
Attorney, Agent, or Firm—Steven M. Rabin

[57] ABSTRACT

A Schmitt trigger circuit which eliminates malfunctions due to high frequency noise and is operable for signals in the direct current region, includes a resistor provided between an input terminal and an input node of MOS inverters, and a capacitor provided in feedback loop. The resistor and the capacitor act as a low pass filter. The capacitor maintains the Schmitt operation by its charging operation, despite the inclusion of noise in the input signal.

6 Claims, 5 Drawing Sheets

SCHMITT TRIGGER CIRCUIT WITH CMOS INVERTERS AND FILTERING MEANS

CROSS-REFERENCE TO RELATED APPLICATION

This application claims priority benefits under 35 U.S.C §119 of Japanese application Serial No. 4-084,288, filed Apr. 7th, 1992, the entire disclosure of which is incorporated herein by reference.

BACKGROUND OF THE INVENTION

1. Field of the Invention

This invention relates to a Schmitt trigger circuit and more particularly to a Schmitt trigger circuit used as an input interface of an integrated circuit or the like.

2. Description of the Related Art

A Schmitt trigger circuit is designed with a weakened loop gain from positive feedback, so as to operate as a limiter. The circuit generates a rectangular-wave signal when triggered by a sinusoidal input signal of predetermined positive and negative voltage levels, using hysteresis of the circuit for selection.

A typical, conventional Schmitt trigger circuit in a complementary MOS transistor integrated circuit (hereinafter called "CMOS") is composed of an input resistor, two series connected CMOS inverters and a resistive feedback loop. In such a circuit, hysteresis is set according to a ratio of resistances of the input and feedback resistors. If the amplitude of a sinusoidal input signal applied to the input terminal exceeds the threshold voltage of the first inverter upon reaching its input node, the signal is inverted by the first inverter. If the level of the inverted signal exceeds the threshold voltage of the second inverter, the signal is again inverted. The output of the second inverter is fed back to the input node through the feedback resistor. Therefore, a rectangular-wave output signal is output from the second inverter.

In this type of Schmitt trigger circuit, when the threshold voltages of the CMOS inverters are set at ½ of the supply voltage, levels of hysteresis of the circuit are easily set by the resistance ratio. However, as seen through the input terminal, the input and feedback resistors form a resistive path. This circuit therefore has high current consumption.

Another known Schmitt trigger circuit has been proposed to solve the problem of high current consumption. This Schmitt trigger circuit substitutes capacitors at the positions of the input and feedback resistors, so that the impedance thereof is high.

In the operation of such a Schmitt trigger circuit, the voltage of the input signal drops across the input capacitor in proportion to the ratio of the impedance of the input capacitor to the sum of the respective impedances of the input and feedback capacitors. Since capacitive impedance is inversely proportional to capacitance, it is possible to increase the impedance by reducing the capacitance. Therefore, when this Schmitt trigger circuit is provided in an integrated circuit, an increase in impedance, and a corresponding reduction of capacitance, can contribute to a designed shrinkage of the integrated circuit.

However, this circuit presents problems as well. In the case where the input signal is in a low frequency band, i.e. a direct current region, the impedance of the input capacitor may become so high that the input signal cannot be transmitted through the circuit. That is, the voltage on the input node of the first inverter may be reduced to such an extent that the Schmitt trigger circuit cannot operate properly. Thus, the circuit cannot transmit signals in a direct current region. In addition, this circuit is prone to malfunction when the input signal contains noise.

Therefore, these circuits do not satisfy a need for a Schmitt trigger circuit having a lower current consumption, sufficient characteristics to permit operation without malfunction even when the input signal contains noise, and adequate operation in the direct current region.

SUMMARY OF THE INVENTION

It is an object of the invention to provide a Schmitt trigger circuit having a lower current consumption, characteristics sufficient to permit operation without malfunction, even when the input signal contains noise, and adequate operation in the direct current region.

It is another object of the invention to provide a Schmitt trigger circuit which may be reduced in size to be a part of a monolithic integrated circuit.

The foregoing objects are accomplished by providing a Schmitt trigger circuit which includes an inverter circuit having an even number of MOS inverters, the MOS inverters being connected in series between an input node of the first inverter and an output terminal, an input resistor circuit connected between an input terminal and the input node, and a feedback capacitor circuit connected in parallel with the MOS inverters, between the input node and the output terminal. In a preferred embodiment, the resistor circuit, MOS inverters, and capacitor circuit are formed on a semiconductor substrate, as a part of a monolithic integrated circuit.

The feedback capacitor prevents superposition of input noise on the output signal. The input resistor and the feedback capacitor together act as a low pass filter for the input signal. Therefore, high frequency noise in the input signal cannot sufficiently reduce the amplitude of the signal at the input node of the first inverter to cause a malfunction. Also, the feedback capacitor reduces the level of feedback current, thereby reducing current consumption.

BRIEF DESCRIPTION OF THE DRAWINGS

The above and other objects and features of the invention will be apparent to those skilled in the art from the following detailed description of preferred embodiments thereof, when considered together with the accompanied drawings in which.

DETAILED DESCRIPTION OF THE PREFERRED EMBODIMENTS

Figure 1:
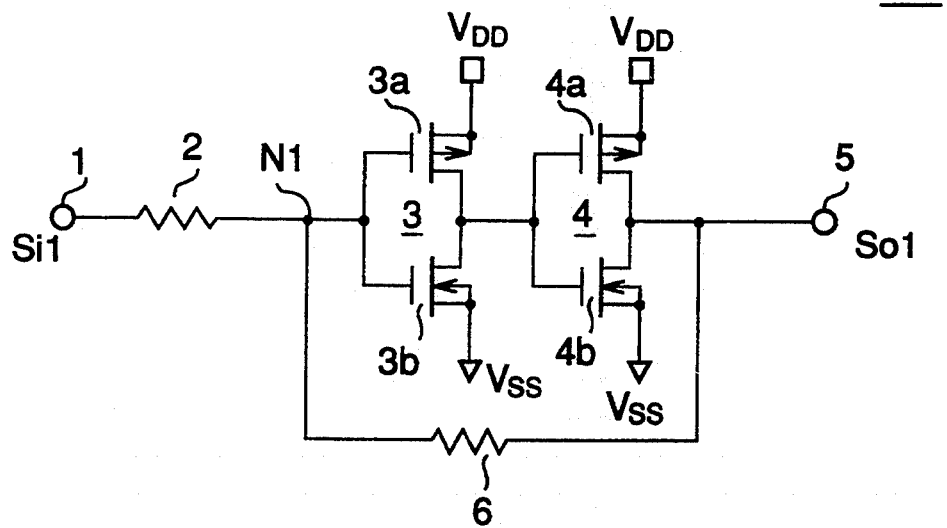
FIG. 1 is a circuit diagram of a conventional Schmitt trigger circuit.
Figure 2:
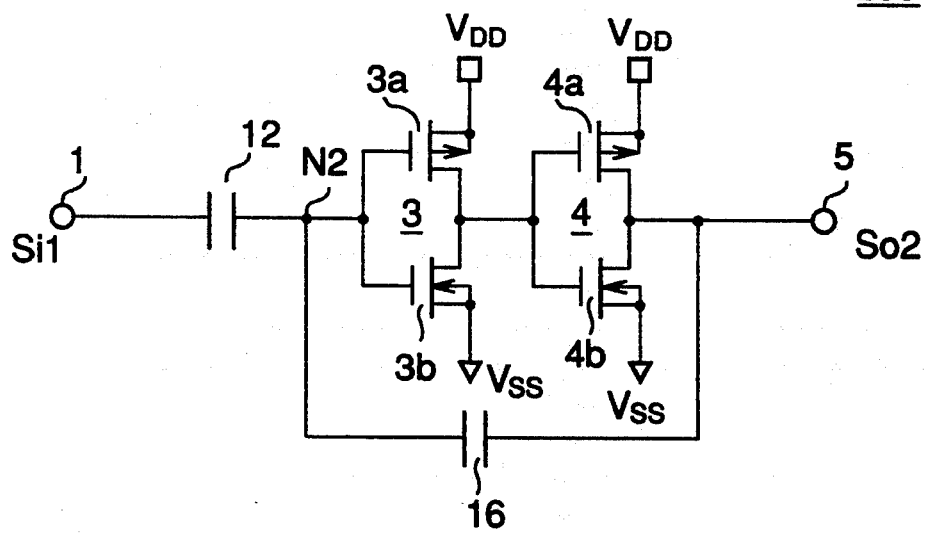
FIG. 2 is a circuit diagram of another conventional Schmitt trigger circuit.

FIGS. 1 and 2 illustrate conventional Schmitt trigger circuits for use in a complementary MOS transistor integrated circuit (hereinafter called "CMOS"). Referring first to FIG. 1, a Schmitt trigger circuit 100 includes an input terminal 1 for receiving an input signal Si1. The terminal 1 is connected to an input node N1 of a first CMOS inverter 3 through a resistor 2. The inverter 3 and a second CMOS inverter 4 are connected in series. The output side of the inverter 4 is connected to an output terminal 5 for outputting an output signal So1. The first inverter 3 is composed of a p-channel MOS (hereinafter "pMOS") transistor 3a and an n-channel MOS (hereinafter "nMOS") transistor 3b, which are connected in series between a power supply potential VDD and a ground potential VSS. Similarly, the second CMOS inverter 4 is composed of a pMOS transistor 4a and an nMOS transistor 4b, which are connected in series between the power supply potential VDD and the ground potential VSS. A feedback resistor 6 is provided between the output terminal 5 and the input node N1.

The values of the resistors 2 and 6 determine the hysteresis of the circuit. If the voltage of the input signal, when it reaches the input node N1, exceeds the threshold voltage of the first CMOS inverter 3, the signal is inverted at the output of the inverter 3. If the inverted signal exceeds the threshold voltage of the second CMOS inverter 4, the signal is again inverted at the output of the second CMOS inverter 4. The output of the second CMOS inverter 4 is fed back to the input node N1 through the resistor 6. Therefore, a rectangular-wave output signal So1 is output from the output terminal 5.

A direct current path through the resistors 2, 6, as seen from the input terminal 1 in FIG. 1, can create high current consumption. To solve this problem the Schmitt trigger circuit 200 shown in FIG. 2 has been proposed.

Referring to FIG. 2, the Schmitt trigger circuit 200 is identical to the circuit of FIG. 1, except that the capacitors 12, 16 respectively replace the resistors 2, 6. High current consumption therefore is avoided. However, when the input signal Si1 is of low frequency, the input impedance of the capacitor 12 may become so high that the level of the signal at the input node N1 is insufficient to cause a response from the inverters. Thus, the circuit cannot operate properly in a direct current region. Moreover, noise in the input signal is more likely to cause circuit malfunction. The invention overcomes the above problems of the Schmitt trigger circuits of FIGS. 1 and 2.

Figure 3:
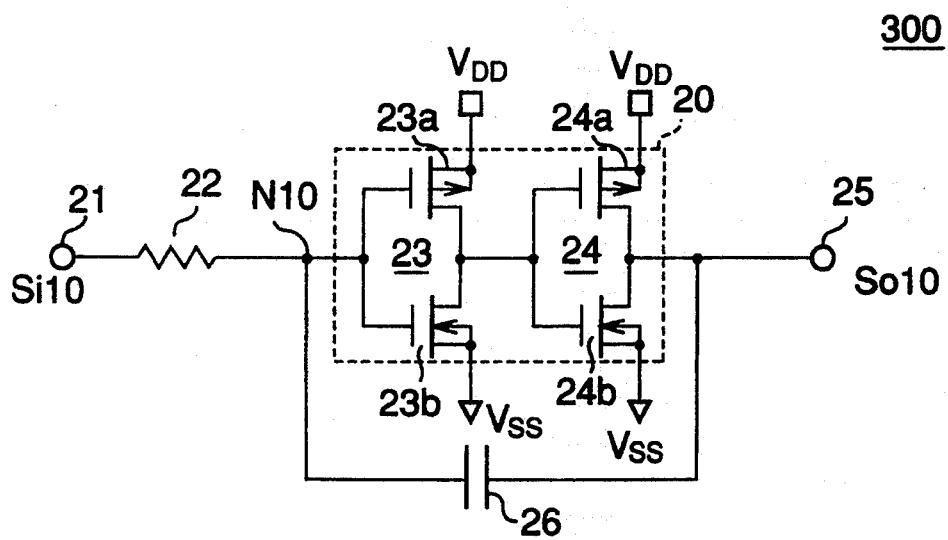
FIG. 3 is a circuit diagram of a Schmitt trigger circuit according to the invention.

FIG. 3 shows a Schmitt trigger circuit 300 according to a preferred embodiment of the invention. This Schmitt trigger circuit uses CMOS transistors and may be used, for example, as an input interface of a CMOS integrated circuit fabricated on a silicon substrate by known semiconductor processes.

The Schmitt trigger circuit 300 has an input terminal 21 for an input signal Si10. The input terminal 21 is connected to an input node N10, for an inverter circuit 20, through an input resistor 22. The inverter circuit has an even number of inverters connected in series. In the illustrated embodiment, the inverter circuit 20 has two CMOS inverters, including a first CMOS inverter 23 connected to the node N10. An output node of the inverter 23 is connected to an input node of a second CMOS inverter 24, so that the pair of the CMOS inverters 23, 24 are connected in series. An output node of the second inverter 24 is connected to an output terminal 25, for transferring signals to an internal circuit of the integrated circuit (not shown). The first inverter 23 includes a pMOS transistor 23a and an nMOS transistor 23b, connected in series between a power supply potential VDD and the ground potential VSS. Similarly, the second CMOS inverter 24 includes a pMOS transistor 24a and an nMOS transistor 24b, connected in series between the power supply potential and the ground potential. A feedback capacitor 26 is provided between the output terminal 25 and the input node N10.

Figure 4:
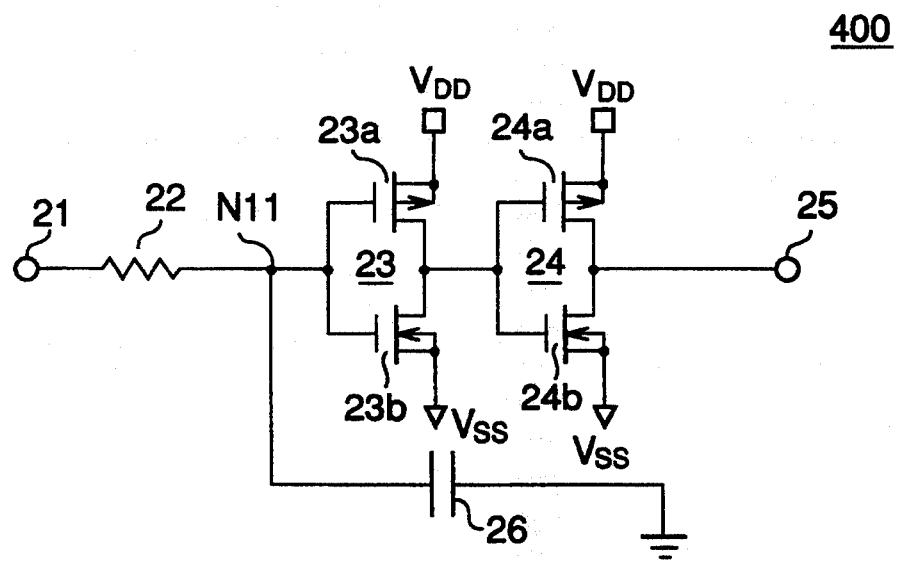
FIG. 4 is a circuit diagram of an explanatory circuit obtained by modifying the circuit of FIG. 3 to connect its capacitor to the ground potential at its side opposite to the input node of the first inverter.
Figure 5:
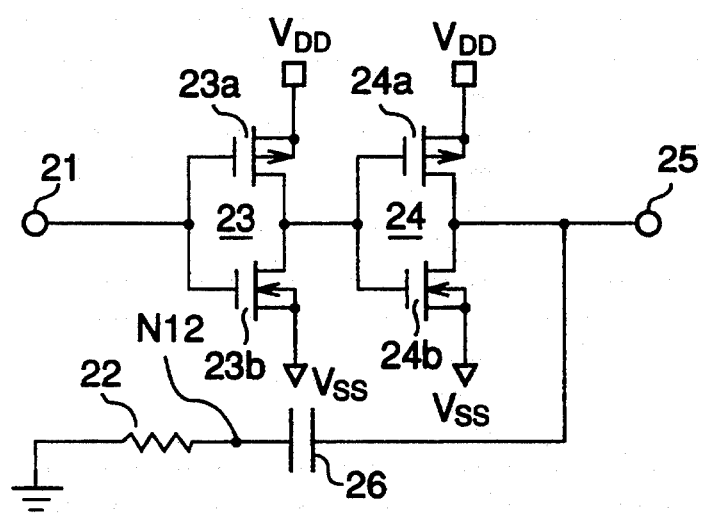
FIG. 5 is a circuit diagram of another explanatory circuit obtained by modifying the circuit of FIG. 3 to separate its resistor and capacitor from the input terminal and connect the resistor to the ground potential.
Figure 6:
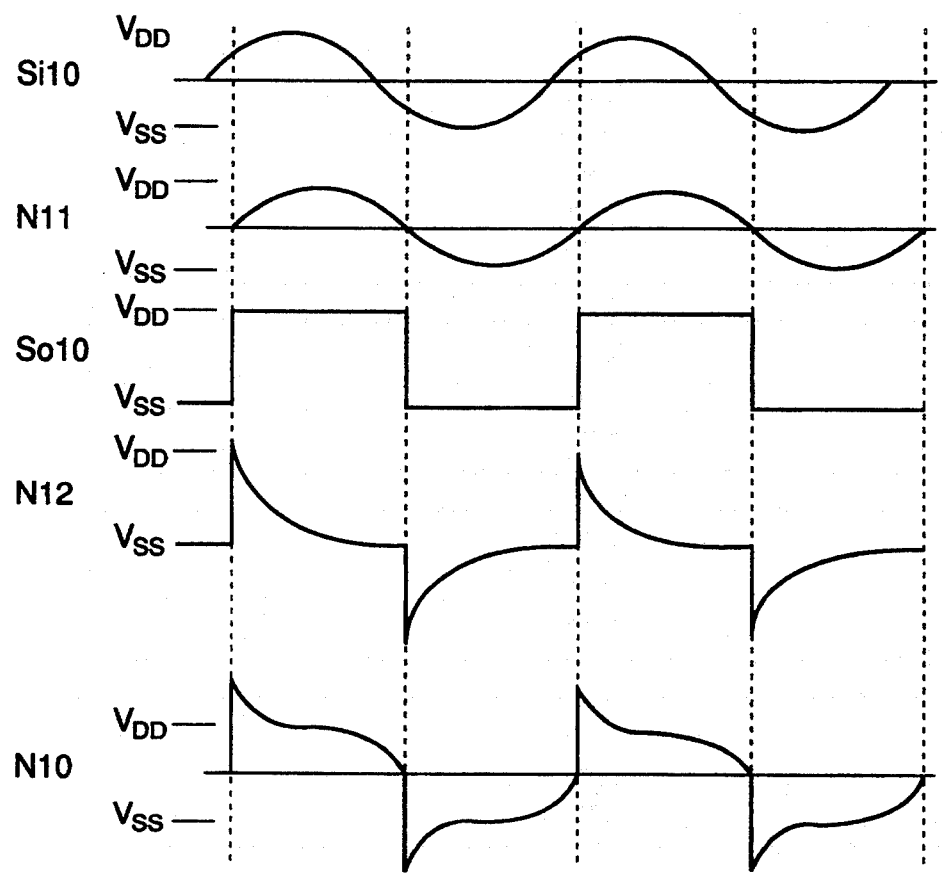
FIG. 6 is a time chart illustrating voltage levels at points in the circuits shown in FIGS. 3 to 5.

The operation of the Schmitt trigger circuit 300 of FIG. 3 now will be explained with reference to FIGS. 4–6. FIGS. 4 and 5 show modifications of the Schmitt trigger circuit of FIG. 3, which together with FIG. 6, illustrate how the invention operates. FIG. 6 is a time chart illustrating voltage level changes at different points in the circuits of FIGS. 3 to 5.

The operating characteristics of the circuit 400 shown in FIG. 4 illustrate how the resistor 22 and capacitor 26 effect the input response of the Schmitt trigger circuit 300. The circuit 400 differs from the Schmitt trigger circuit of FIG. 3 only in that its capacitor 26 is connected to the ground potential at the side opposite to the input node N10. As shown in FIG. 6, if a sinusoidal input signal Si10 is fed to the input terminal 21, the phase of the signal at the input node N11 for the first CMOS inverter 23, is delayed, and its amplitude is reduced. This is because the resistor 22 and the capacitor 26 is seen by the signal Si10 as a low pass filter.

The operating characteristics of the circuit 500 shown in FIG. 5 illustrate the effect of the resistor 22 and capacitor 26 on how the output signal So10 is fed back to the input node. The circuit 500 differs from the Schmitt trigger circuit of FIG. 3 only in that the capacitor 26 is connected to ground through the resistor 22, and both the resistor and the capacitor are separated from the input node N12 of the inverter 23. As shown in FIG. 6, if a sinusoidal input signal Si10 is fed to the input terminal 21 of the circuit 500, the output signal So10 at the output terminal 25 is a rectangular wave. The resistor 22 and the capacitor 26 act as a differentiator of the output signal. Thus, as shown in FIG. 6, the signal at the node N12 corresponds to a differentiation of the output signal So10.

The resistor 22 and capacitor 26 in the Schmitt trigger circuit 300 shown in FIG. 3 perform both a low pass filter function on the input signal, and a differentiation function on the fed back output signal. Thus, the Schmitt trigger circuit performs both of the functions described with reference to the explanatory circuits 400 and 500 shown in FIGS. 4 and 5, and provides, at the input node N10, a signal which is a composite of the node signals N11 and N12 of the circuits 400 and 500.

Therefore, as shown in FIG. 6, when a sinusoidal input signal Si10 is fed to the input terminal 21, a node signal N10 appears at the input node N10 of the first CMOS inverter 23. If the level of the node signal N10 exceeds the threshold voltage of the first CMOS inverter 23, the inverter 23 drives the second CMOS inverter 24 inversely. Then, if the voltage level at the gate of the second CMOS inverter 24 exceeds the threshold voltage thereof, the inverter 24 drives the output terminal 25 to the opposite voltage level. Thus, a rectangular-wave output signal So10, as shown in FIG. 6, is provided on the output terminal 25.

Figure 7:
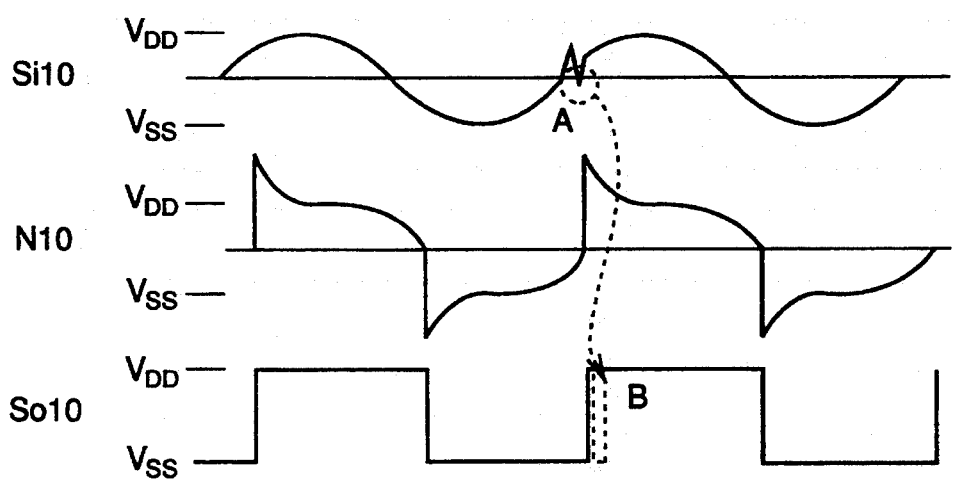
FIG. 7 is a time chart illustrating voltage levels at points in the Schmitt trigger circuit shown in FIG. 3, in a case where the input signal includes noise.

FIG. 7 illustrates the operation of the Schmitt trigger circuit 300 when the input signal Si10 includes noise. In FIG. 7, the input signal So10 includes noise in the form of positive voltage spike at a point A when the signal is at a transition level around ½ VDD. The voltage level at the node N10 responds to the voltage rise a little more quickly than it would absent the spike. That is, the output voltage So10 rises rapidly to its peak positive value and is positively fed back from the output terminal 25 to the node N10 through the capacitor 26, thereby immediately increasing the voltage level on the node N10 to above VDD. As a result, even though, at the end of the spike, the noise causes the voltage level of the input signal S10 to drop below VDD, the voltage level on the node N10 never drops below threshold voltage of the CMOS inverter 23. Therefore, noise such as is represented by a dotted line at the point B in FIG. 7, will not appear in the output signal So10.

Thus, in the Schmitt trigger circuit 300, the low pass filter composed of the resistor 22 and the capacitor 26 operates similarly to its operation in the circuit shown in FIG. 4, to reduce the amplitude of high frequency noise in the input signal. This operation, in cooperation with the Schmitt operation, accomplishes the important objective of any Schmitt trigger circuit to avoid malfunctions caused by noise, and does so even when the differential between the thresholds of the circuit is small. In addition, the Schmitt trigger circuit can reduce current consumption by reducing the feedback current. Moreover, the Schmitt trigger circuit can transmit signals in the direct current region since an input resistor is retained.

Since the Schmitt trigger circuit 300 is composed of pMOS transistors 23a, 24a, nMOS transistors 23b, 24b, an ordinary resistor 22, and an ordinary capacitor 26, the circuit can be formed compactly on a semiconductor substrate as a part of a monolithic integrated circuit.

According to another embodiment the invention, the CMOS inverters may be formed by MOS inverters composed of solely pMOS or nMOS transistors, and the resistor 22 and the capacitor 26 may be formed by modified MOS transistors or the like.

It is understood that although the present invention has been described in detail with respect to preferred embodiments thereof, various other embodiments and variations are possible to those skilled in the art which fall within the scope and spirit of the invention, the invention being limited only by the following claims.

What is claimed is:

1. A Schmitt trigger circuit, comprising:
   an input terminal;
   an output terminal;
   an input node;
   an inverter circuit having an even number of MOS inverters, said MOS inverters connected to each other in series between said input node and said output terminal;
   an input resistor circuit, connected between said input terminal and said input node; and
   a feedback capacitor circuit, connected in parallel with said MOS inverters, between said input node and said output terminal.

2. A Schmitt trigger circuit according to claim 1, wherein said resistor circuit, said MOS inverters, and said capacitor circuit are formed on a semiconductor substrate.

3. A Schmitt trigger circuit, comprising:
   an input terminal for receiving an input signal;
   an output terminal for outputting an output signal;
   an input node;
   an inverter circuit, including an even number of MOS inverters, said MOS inverters being connected in series between said input node and said output terminal;
   an input impedance circuit, connected between said input terminal and said input node; and
   a feedback impedance circuit, connected in parallel with said inverter circuit, between said input node and said output terminal, said input impedance circuit and said feedback impedance circuit together functioning as a low pass filter that reduces the amplitude of high frequency components of the input signal passed to the input node, and said input impedance circuit and said feedback impedance circuit together further functioning as a differentiator that differentiates the output signal and passes the differentiated output signal to the input node.

4. A Schmitt trigger circuit, comprising:
   an input terminal for receiving an input signal;
   an output terminal for outputting an output signal;
   an impedance circuit coupled between said input terminal and said output terminal, said impedance circuit having an output node for outputting a modified signal; and
   an inverter circuit having an inverter circuit input coupled to the output node of said impedance circuit and an inverter circuit output coupled to said output terminal, said inverter circuit further having an even number of MOS inverters, said MOS inverters being connected in series between the inverter circuit input and the inverter circuit output,
   wherein said impedance circuit comprises means for low pass filtering the input signal and passing the low pass filtered input signal to the input node, and
   differentiating the output signal and passing the differentiated output signal to the input node, the modified signal being a composite signal of the differentiated output signal and the low pass filtered input signal.

5. A Schmitt trigger circuit, comprising:
   an input terminal;
   an output terminal;
   an input node;
   an inverter circuit having an even number of MOS inverters, said MOS inverters connected to each other in series;
   a feedback capacitor circuit, disposed in parallel with said inverter circuit, said inverter circuit and said feedback capacitor circuit both connected between said input node and said output terminal; and
   an input resistor circuit, connected between said input terminal and said input node.

6. A Schmitt trigger circuit according to claim 5, wherein said even number of MOS inverters includes
   a first MOS inverter having
      an input coupled to said input node, and
      an output; and
   a second MOS inverter having
      an input connected to the output of the first MOS inverter, and
      an output coupled to said output terminal.

* * * * *